US009672886B2

(12) United States Patent
Wang et al.

(10) Patent No.: US 9,672,886 B2
(45) Date of Patent: Jun. 6, 2017

(54) FAST AND LOW-POWER SENSE AMPLIFIER AND WRITING CIRCUIT FOR HIGH-SPEED MRAM

(71) Applicant: THE REGENTS OF THE UNIVERSITY OF CALIFORNIA, Oakland, CA (US)

(72) Inventors: Kang L. Wang, Santa Monica, CA (US); Pedram Khalili Amiri, Los Angeles, CA (US); Hochul Lee, Los Angeles, CA (US); Juan G. Alzate, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 213 days.

(21) Appl. No.: 14/704,936

(22) Filed: May 5, 2015

(65) Prior Publication Data
US 2017/0084322 A1 Mar. 23, 2017

Related U.S. Application Data

(60) Provisional application No. 61/988,518, filed on May 5, 2014.

(51) Int. Cl.
*G11C 11/00* (2006.01)
*G11C 11/16* (2006.01)

(52) U.S. Cl.
CPC .......... *G11C 11/1673* (2013.01); *G11C 11/16* (2013.01); *G11C 11/161* (2013.01); *G11C 11/1675* (2013.01)

(58) Field of Classification Search
CPC ....... G11C 11/16; G11C 13/0069; G11C 7/22; G11C 7/1051; G11C 7/1078; G11C 7/1006; G11C 11/419; G11C 7/12; G11C 11/4091; G11C 7/062; B82Y 10/00
USPC ............ 365/158, 129, 148, 189.011, 189.15, 365/189.16, 189.14, 189.05, 189.07, 365/189.12, 190, 202, 207, 208, 209
See application file for complete search history.

(56) References Cited

U.S. PATENT DOCUMENTS 7,634,699 B2 * 12/2009 Randell ............ G01R 31/31719
714/718

* cited by examiner

*Primary Examiner* — Fernando Hidalgo
(74) *Attorney, Agent, or Firm* — O'Banion & Ritchey LLP; John P. O'Banion

(57) ABSTRACT

A fast and low-power sense amplifier and writing circuit for high-speed Magnetic RAM (MRAM) which provides the long retention times and endurance of magnetic tunnel junction (MTJ) cells, while providing faster access speeds, verified writes, and an increased sensing margin. A high-speed and low-power pre-read and write sense amplifier (PWSA) provide VCMA effect precessional switching of MTJ cells which include pre-read and comparison steps which reduce power consumption. An embodiment of the PWSA circuit is described with write and pre-charge circuit, S and D latches, comparison circuit, and a differential amplifier and control circuit.

25 Claims, 10 Drawing Sheets

FAST AND LOW-POWER SENSE AMPLIFIER AND WRITING CIRCUIT FOR HIGH-SPEED MRAM

CROSS-REFERENCE TO RELATED APPLICATIONS

This application claims priority to, and the benefit of, U.S. provisional patent application Ser. No. 61/988,518 filed May 5, 2014, incorporated herein by reference in its entirety.

STATEMENT REGARDING FEDERALLY SPONSORED RESEARCH OR DEVELOPMENT

This invention was made with Government support under HR0011-10-C-0153, awarded by the U.S. Department of Defense, Defense Advanced Research Projects Agency. The Government has certain rights in the invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND

1. Technological Field

This technical disclosure pertains generally to a sense amplifier and writing circuit for high-speed MRAM, and more particularly to a high-speed and low-power pre-read and write sense amplifier (PWSA) for high-speed MRAM.

2. Background Discussion

Magnetoresistive random access memory (MRAM) is a promising next-generation emerging memory technology that can provide non-volatility and low write energy with fast read and write speeds, long retention times (above 10 years) and endurances greater than $10^{16}$ program cycles. Magnetic tunnel junctions (MTJs) have become basic building blocks of MRAM, where relatively high tunneling magnetoresistance (TMR) ratios achieve two distinguishable resistive states, generally referred to as parallel (P) and anti-parallel (AP) states.

Recently, there has been increasing interest in ultrafast precessional (i.e., resonant) switching of MTJs, using both current (via the spin transfer torque, STT effect), and voltage (via the voltage-controlled magnetic anisotropy, VCMA effect) pulses. In STT devices, precessional switching is achieved by incorporating an orthogonal combination of free and fixed layers into the device, where the large spin torque from the perpendicular fixed layer sets the free layer magnetization into a precessional motion, resulting in resonant switching. Alternatively, in the case of voltage controlled MTJ devices, the VCMA effect originates from the fact that the interface of oxides with metallic ferromagnets (e.g., CoFeB|MgO) shows a large perpendicular magnetic anisotropy (PMA), which is sensitive to voltages applied across the dielectric layer. This effect is caused by the electric field induced modulation of the relative occupancy of d orbitals at the interface. Since the PMA is modulated due to the applied voltage, a torque is exerted on the free layer magnetization, setting it into a precessional motion, thereby causing switching.

Precessional switching offers the advantages of very high speed (down to approximately 100 ps) and low switching energy (down to approximately 1 fJ/bit using the VCMA effect and about 100 fJ/bit using the STT effect). However, it also presents a number of new challenges. The first one is difficulty in determining the switching direction. In principle, the state of the magnetic bit is always reversed during resonant switching, irrespective of its initial state. Despite this issue, precessional switching only requires one pulse shape (amplitude and length) to write both the parallel (P) and antiparallel (AP) data states. This greatly simplifies the pulse generation circuitry and provides more symmetric writes (which is better for device reliability and/or endurance).

Due to its high density, a one transistor and one magnetic tunnel junction (1 T-1 MTJ) cell is the most widely used bit-cell for MRAM. However, the available sensing margin is small due to the low tunneling magnetoresistance (TMR) of the 1T-1 MTJ memory architecture: i.e., the series bit line (BL) resistance decreases the resistance ratio of MTJs seen by the sensing circuitry. Furthermore, since a bias across the MTJ reduces its resistance, especially the resistance in the anti-parallel state, the TMR is diminished compared to the case of zero biased. This reduction further lowers the sensing margin, causing an increased possibility of an erroneous read.

Accordingly, a need exists for circuitry for performing ultrafast precessional switching of MTJs while providing increased sensing margins, with lowered error rates. The present disclosure achieved a high sensing margin while overcoming shortcomings of previous MTJ sense amplifier and writing circuits.

BRIEF SUMMARY

A high-speed and low-power pre-read and write sense amplifier (PWSA) is described for magnetoresistive random access memory (MRAM). The sense amplifier incorporates a writing circuit for MRAM bits switched via timing of precessional dynamics (approximately GHz speed) in a magnetic tunnel junction (MTJ). By combining read and write functions in a single power-efficient circuit, the PWSA allows for fast read and write operations while minimizing the bit error rate (BER) after data programming. In the embodiment described, the PWSA circuit is designed based on a 65 nm CMOS technology, although it will be appreciated that the disclosed circuit approach is applicable to other circuit technologies and feature dimensions. The approach has been tested with magnetic dynamics captured by a Verilog-A compact model based on macrospin behavior for MTJs. Using the pre-read and comparison steps in the data program operation, the disclosed approach provides reduction in write power consumption by up to 50% under random data input conditions. Furthermore, by using the voltage controlled magnetic anisotropy (VCMA) effect for precessional switching, more than 10× reduction of write power and transistor size both in the memory cell and the write circuit is achieved, compared to using the spin transfer torque (STT) effect. The circuit achieves 2 ns read time, 1.8 ns write time, and 8 ns total data program operation time (consisting of two Read steps, one Write step and a Pass/Fail check step) by using this PWSA concept and a 2× larger sensing margin through the current feedback circuit.

Further aspects of the presented technology will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The disclosed technology will be more fully understood by reference to the following drawings which are for illustrative purposes only:

DETAILED DESCRIPTION

1. Introduction

Figure 1A:
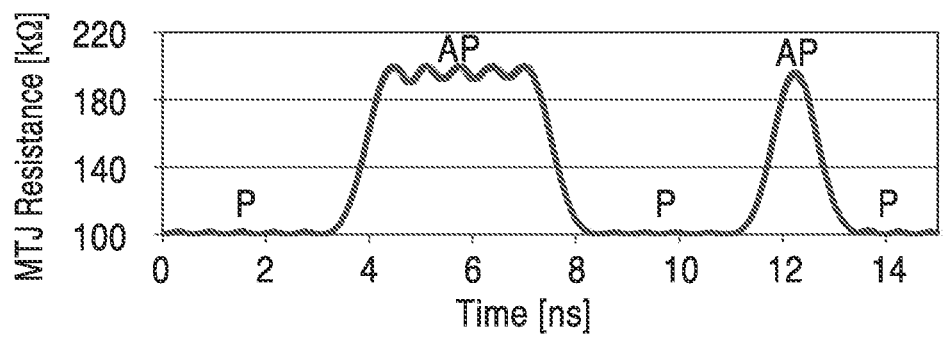
FIG. 1A through FIG. 1C are switching waveform plots of MTJ resistance, write voltage and write current, as utilized according to an embodiment of the present disclosure.

The present technology provides a number of benefits for MTJ memory cells including, but not limited to, the following abilities: (i) to enable reliable precessional programming for high-speed operation, by reducing the BER, while allowing for a large write error rate (WER) (up to 1%) of the precessional switching process; (ii) to reduce write power by utilizing a pre-read process for eliminating redundant writes; and (iii) to increase the sensing margin for reliable read operation by using a current feedback circuit.

In the present disclosure, the bit error rate (BER) is defined as the number of bit errors divided by the total number of programmed bits after a full data program operation. Each full data program operation, in turn, may consist of multiple write operations into an individual bit. The acceptable bit error rate (ABER) is the maximum BER which can be corrected by error-correction code (ECC) techniques. The write error rate (WER), in turn, is defined for a single bit as the probability of not switching (i.e., write error) in response to a single write pulse.

2. Compact Model of Magnetic Tunnel Junction

An MTJ is comprised of two ferromagnetic layers divided by a tunneling (oxide) layer, where the magnetic moment of one layer is fixed and the other can change freely based on electrical and magnetic bias conditions. The magnetization of the MTJ's free layer has two energetically stable states. When the magnetic moments of the free and fixed layers are aligned in the same direction, the parallel state (denoted as P), the MTJ device has a low resistance (denoted as $R_P$). In the anti-parallel state (denoted as AP), the free layer magnetization is in the opposite direction to the fixed layer, resulting in a high MTJ resistance (denoted as $R_{AP}$). In this disclosure MTJs are principally considered with out-of-plane (perpendicular) magnetization, which are more scalable than in-plane devices for advanced technology nodes while retaining thermal stability.

Depending on the required speed of the reversal, switching of MTJs can be performed via precessional or thermally activated switching. Precessional (also referred to as resonant) switching occurs when a perpendicularly magnetized free layer of an MTJ is set into a precessional motion around an in-plane magnetic field (such as a field created by shape anisotropy, a bias field, or an effective magnetic field otherwise built into the device) by either STT or VCMA effects. This switching scheme is typically much faster than the thermally activated process.

To model the magnetic dynamics and verify the performance of the disclosed PWSA approach in Spectre circuit simulations, a compact model is utilized which allows capturing precessional switching of MTJs, while including both STT and VCMA effects. During precessional switching, the magnetic moment of the free layer changes its state to the opposite state within nanosecond or sub-nanosecond time scales. All the switching dynamics are described by the Landau-Lifshitz-Gilbert (LLG) equation in the macrospin approximation, and account for bias dependence of resistance as well as thermal noise effects.

Compared to STT-based precessional switching, VCMA driven switching has two main advantages: (i) more than 10× reduction of switching energy compared to STT-based switching due to lower currents; and (ii) up to a 10× decrease in the size of the access transistors of the memory cell and those of the write circuit.

Figure 1B:
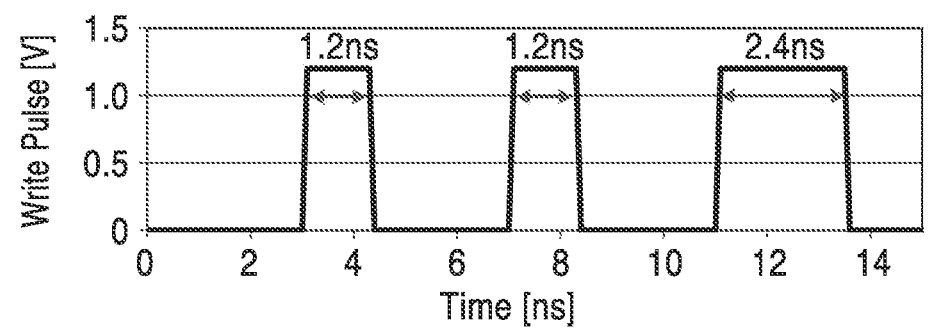
Figure 1C:
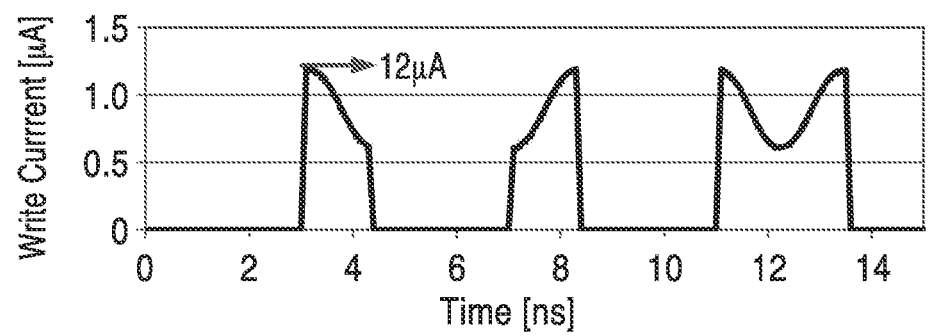
Figures 2A, 2B, 2C:
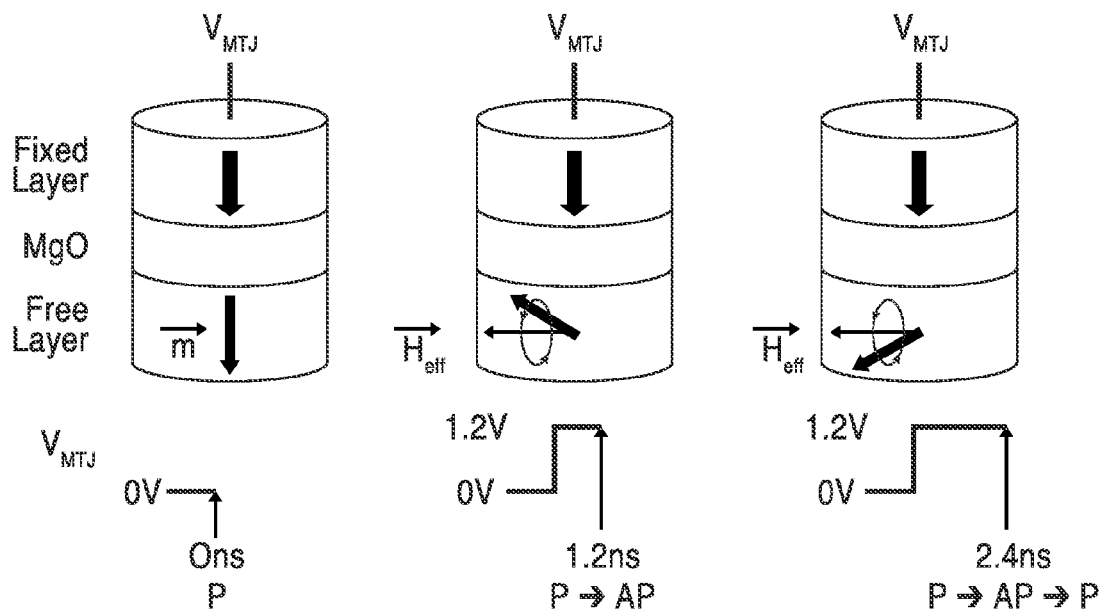
FIG. 2A through FIG. 2C are diagrams and associated $V_{MTJ}$ waveforms for a precessional switching process for an MRAM cell according to an embodiment of the present disclosure.

FIG. 1A through FIG. 1C along with FIG. 2A through FIG. 2C illustrate switching waveforms (FIG. 1A through FIG. 1C) and MTJ cells (FIG. 2A through FIG. 2C) being switched. FIG. 1A through FIG. 1C depict simulation results of the compact model for VCMA-induced precessional switching of MTJ devices, with MTJ resistance seen in FIG. 1A, a write pulse voltage waveform seen in FIG. 1B, and write current seen in FIG. 1C which is associated with the write pulse voltage of FIG. 1B. The small write currents (below 15 μA) allow for low-power write.

In FIG. 2A through FIG. 2C a precessional switching process is seen in an MRAM cell, along with applied voltage $V_{MTJ}$. The MRAM cell is shown with a fixed layer, a tunneling layer (e.g., MgO layer, or other oxide layer), and a free layer. As seen in the transition from FIG. 2A to FIG. 2B, a 1.2 ns write pulse is able to switch an MTJ state from P to AP or from AP to P, demonstrating the resonant but non-deterministic characteristics of precessional switching, where the state of the bit is always reversed regardless of its initial state for a given pulse duration (1.2 ns in this case). As seen in FIG. 2C, a 2.4 ns write pulse causes one round trip precession (complete precession), hence the MTJ remains in the same state after the applied pulse is removed.

By way of example and not limitation, the voltage-controlled magnetic memory bit that is utilized in the embodiments of the present disclosure is described in P. Khalili Amiri, Kang L Wang, Kosmas Galatsis, "Voltage-Controlled Magnetic Anisotropy (VCMA) Switch and Magneto-Electric Memory," PCT International Publication No. WO/2012/159078 published on Nov. 22, 2012 and incorporated herein by reference in its entirety. One of ordinary skill in the art will appreciate that the disclosed circuitry may be utilized with other magnetic memory bits without departing from the teachings of the present disclosure.

Figure 3:
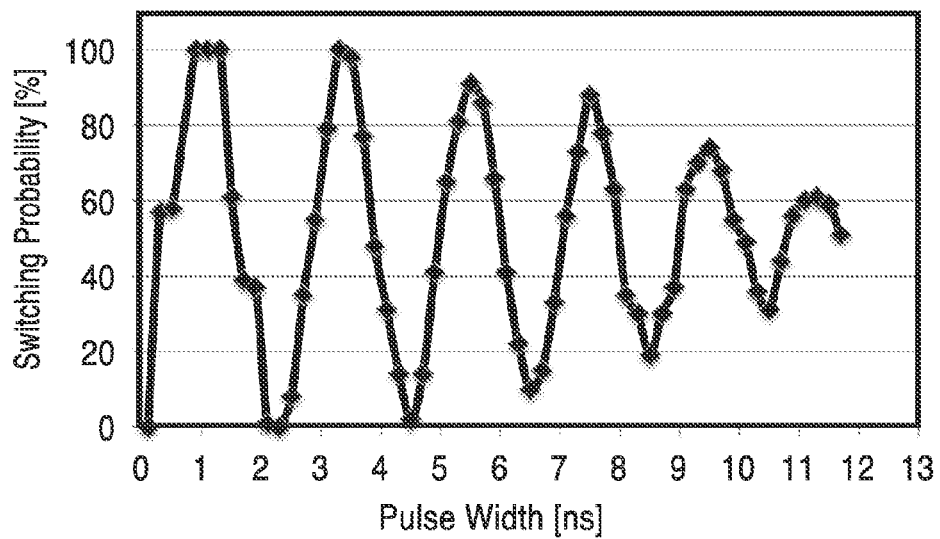
FIG. 3 is a plot of precessional switching probability for an MJT cell as a function of pulse width, as utilized according to an embodiment of the present disclosure.

FIG. 3 depicts the probability of precessional switching as a function of the applied pulse width. It should be recognized that switching probability converges towards 50% in the limit of long pulses, where the switching direction is determined by thermal fluctuations. The oscillatory behavior of the switching probability in principle imposes a challenge to obtain low error rates for the data program operation, especially when variations are considered. The next section seeks to address this issue.

3. Pre-Read and Write Sense Amplifier

A. Data Program Flow

Figure 4:
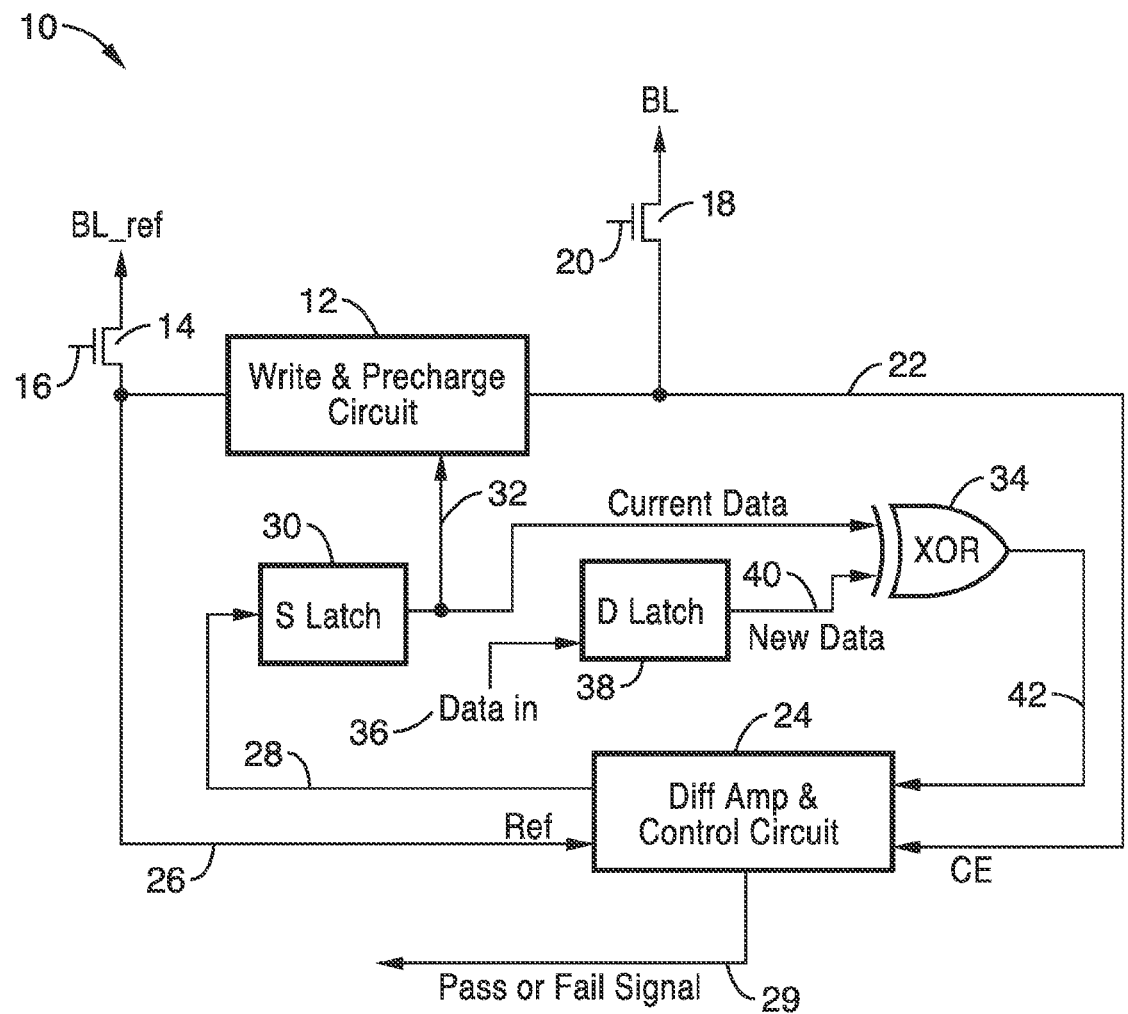
FIG. 4 is a block diagram of a pre-read and write sense amplifier (PWSA) according to an embodiment of the present disclosure.

FIG. 4 illustrates an example embodiment 10 of a pre-read and write sense amplifier (PWSA) according to the present disclosure. The PWSA is seen with a write and pre-charge circuit 12, coupled to bit line transistors 14, 18, which have gate inputs 16, 20, respectively. The BL (bit line) and BL ref (bit line reference) are connected to a MTJ cell array and a reference resistor, respectively. A center node (CE) 22, and a reference signal 26 are seen coupled from write and pre-charge circuit 12 to a combination differential amplifier (Diff-amp) with control circuit 24, which outputs a Diff-amp output signal 28 to a sensing latch (S latch) 30, and a pass or fail signal 29. It will be noted that Diff-amp output signal 28, is the same signal 128 in FIG. 6A, and it plays two roles in this circuit. First, it gives a sensed MTJ state data to S Latch as a digital signal, '0' or '1'. Second, the comparison of the initial MTJ data (S Latch) and the new data (D Latch) is converted to a digital signal through signal 28. It should be appreciated that the differential amplifier and control circuit can be implemented as separate circuits. Output 32 from the sense latch is the current MTJ cell data which is output to write and pre-charge circuit 12, and to a comparison circuit 34, such as exemplified by an XOR gate. Data input 36 is received by a data latch (D latch) 38 which outputs 40 new data to comparison circuit 34. Comparison circuit 34 compares new and current data and outputs signal 42 indicating if a write pulse is necessary. The circuit is designed to perform a read operation and to compare the current MTJ state to the incoming data, leading to a decision on whether a write pulse should be applied.

Figure 5:
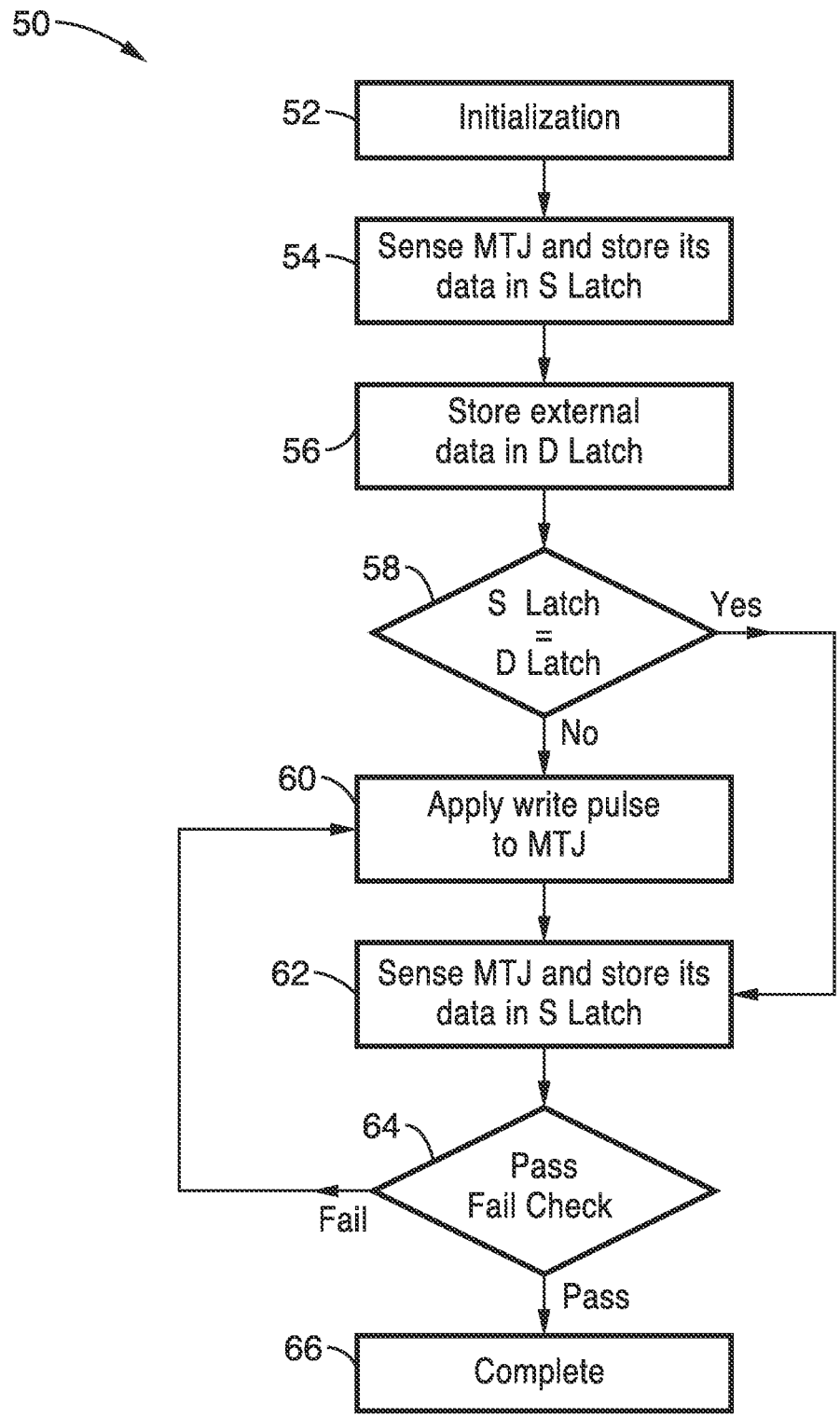
FIG. 5 is a flow diagram of steps performed by the pre-read and write sense amplifier (PWSA) circuit according to an embodiment of the present disclosure.

FIG. 5 illustrates an example embodiment 50 of method steps performed by the PWSA circuitry. After initialization 52, PWSA reads out the initial MTJ state and stores it 54 in the S latch during the pre-read step. A comparison is made 58 if data in the S latch is equal to the data in the D latch. This comparison determines whether to provide a write pulse to the MTJ, based on output of comparing initial MTJ state (S latch) with the external data (D latch). Therefore, depending on the ratio of the read and write energies of a single bit, redundant writes are eliminated for a given partial percentage match between the internal and external data during the pre-read and comparison steps, leading to significant reduction of the total power consumption. If the data of the S latch is not equal to that of the D latch, then a write pulse is applied 60, otherwise this step is skipped with processing moving to step 62. In either case the MTJ state is sensed and stored in the S latch 62.

The MTJ state is verified 64 by comparing the S latch and D latch data. If these latches do not match, then a return to step 60 is made for applying a write pulse to the MTJ, otherwise the operation is complete 66. It will be noted that if the desired data is matched, the operation finishes, and a 'high' Pass signal is transferred to the external circuit. In the case of failure, then the circuit iterates until the MTJ is in the correct state or a threshold condition is reached, such as on the maximum number of iterations n that can be attempted.

Thus, the above discusses operating steps in FIG. 5 for the disclosed PWSA which comprises the pre-read and comparison and write and read and PF steps, described below with reference to FIG. 5 with more particularity.

(1) Pre-read Step. The pre-read step is depicted by blocks 52, 54, 56 in which the PWSA senses the initial MTJ state and stores it in S Latch.

(2) Comparison step. The comparison step is shown by block 58. The result of initial MTJ data and new data determines to generate a write pulse to the MTJ at the Write step. If both data values match, logical value (comparison result) of 'low' will be stored in the S latch, preventing the circuit from applying a write pulse to the MTJ. Otherwise, 'high' will be stored in the S latch, generating a write pulse to the MTJ. Therefore, the circuits are able to reduce not only write power up to 50% but also the BER under the random input condition by decreasing the number of cells which are supposed to be programmed under the conventional scheme.

(3) Write step. Write step is depicted in block 60. Depending on the S latch data, the circuit provides BL with a write pulse. To be specific, having a logic value 'high' in S latch allows the circuit to generate a write pulse to MTJ. On the contrary, if the S latch has 'low', the PWSA is unable to generate write pulse to MTJ.

(4) Read step. The PWSA senses the MTJ state after write pulse is given, or bypassed, as seen in block 62.

(5) PF (Pass/Fail) step. The purpose of this stage, seen in block 64, is to verify whether MTJ is properly programmed or not by comparing with external new data.

It will be appreciated that one of the features which distinguish this approach from others is that it is specialized in controlling precessional switching which has a relatively large write error rate (WER) and is sensitive to write pulse duration and amplitude. By using a pre-read and comparison step, the circuits are able to select the cells which are needed to be programmed to the opposite state, reducing write power and bit error rate (BER) due to the decrease in the number of cells being programmed. Furthermore, the circuit is able to find error cells after the Write step by using pass/fail step which compares current MTJ state with the intended state, decreasing BER further.

Figure 6A:
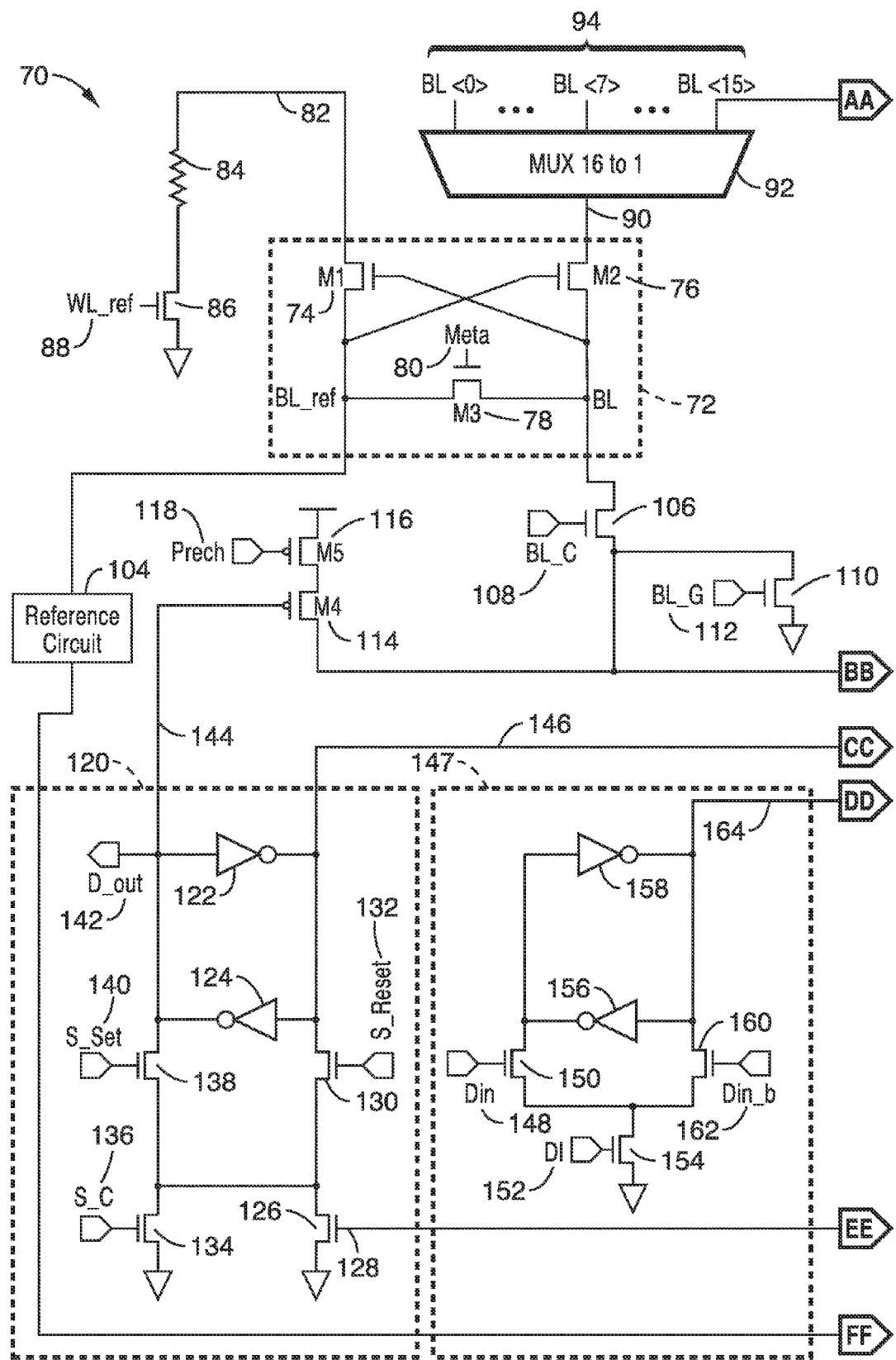
FIG. 6A and FIG. 6B are a schematic of a pre-read and write sense amplifier (PWSA) according to an embodiment of the present disclosure.
Figure 6B:
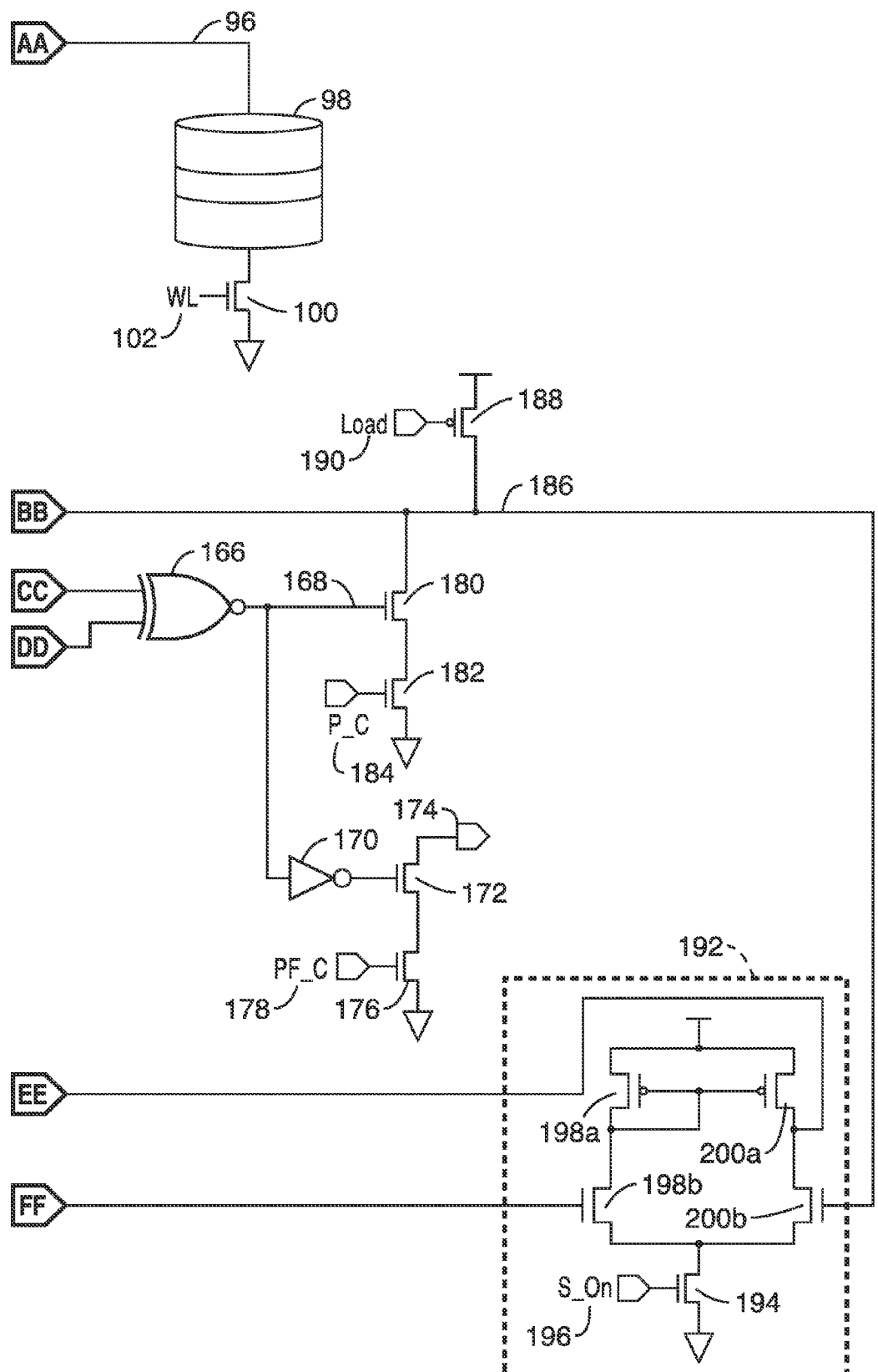

FIG. 6A and FIG. 6B illustrate an embodiment 70 of the sense amplifier and write circuit (PWSA) of the present disclosure. A current feedback circuit 72 is exemplified with transistors 74, 76 and 78 (M1, M2, M3). The gates of transistors 74, 76 (M1, M2) are coupled to the opposite bit line, while transistor 78 (M3) is gated by 'Meta' 80. It will be appreciated that 'meta' means a metastable state, and its use is known in memory circuits. During precharge, the potential of BL and BL_ref can be the same value due to transistor 78 (M3). When 78 (M3) and 116 (M5) turn off, the potential of BL and BL_ref start to discharge. The discharge speeds BL and BL_ref are determined by the resistivity of MTJ (98) and resistor (84), respectively. Because of 74, 76 (M1, M2) the potential difference between BL and BL_ref increases due to the feedback.

The output on BL_ref drive through transistor 74 (M1) as $I_{ref}$ 82 through a resistor 84, in which $R_{ref}=(R_P+R_{AP})/2$, and transistor 86 is controlled by WL_ref 88. WL_ref is a word line reference signal for controlling an access transistor of a reference cell. Output on BL, which is coupled from center node 186 through a transistor 106 gated by signal BL_C 108, with a transistor 110 driven by signal BL_G 112 which can pull it to ground, is output through transistor 76 (M2). By using 108 BL_C (BL Control), the node CE (186) can be electrically disconnected during the comparison step and PF step. It will be noted that for initialization 52 in FIG. 5, BL_G (bit line ground) 112 can pull both BL and 186 down to ground level. Furthermore, BL_G provides a discharge path right after applying a write pulse, and configured for generating a sufficiently short pulse. Signal 90 from transistor 76 (M2) is coupled to the input of a multiplexer 92, exemplified as a 16 to 1 multiplexer with bit line outputs BL<0>, BL<1>, BL<2>, . . . , BL<15> 94. Also coupled to CE 186 is a pull-up transistor 188 controlled by signal Load 190. The purpose of load signal 190 is utilized in the comparison step. After isolating 186 from BL by using the transistor 106, then node 186 is charged up to $V_{DD}$ level through transistor 188 as controlled by load signal 190. Then, the potential of 186 is determined by comparison output 168 when transistor 182 turns on in response to signal P_C 184. If line 146 and line 164 are the same values (MTJ data and new data match), line 168 should be $V_{DD}$ and the potential of 186 is discharged to ground. If line 146 and line 164 are different (MTJ data and new data mismatch), the potential of 186 remains in $V_{DD}$ since the potential of line 168 is ground, which turns transistor 182 off.

A MJT cell 98 is shown receiving an $I_{cell}$ signal 96 from the bit line on one input, and through an access transistor 100 gated to write line (WL) 102. Major blocks are seen in the figure with a reference circuit 104, an S latch 120 receiving an S-latch control signal S_C 136 driving transistor 134, S-latch set signal S_Set 140 (S latch set) driving transistor 138, S_Reset 132 (S latch reset signal) driving transistor 130, and output from reverse coupled inverters 122, 124 as data out 142, which is also seen as signal 144 coupled to transistor 114, in series with another transistor 116 controlled by a pre-charge signal Prech 118. Signals S-latch control S_C 136 and S-latch set S_Set 140 are used to initialize the S latch (120). If these lines 136 and 140 are at $V_{DD}$ then transistors 134, 138 are switched on, and the potential of line 144 become ground due to the discharge path. Whenever the circuit performs a read, the S latch should be initialized by using S_Set and S_C.

A D latch 147 is seen with data input signal Din 148 driving transistor 150, and complementary signal Din_b 162 driving transistor 160, to the reverse-coupled inverters 156, 158, configured for retaining the data state. A data input signal DI 152 drives transistor 154 pulling current from the D latch to ground, with an output signal 164 generated from the D latch. The data input (DI) signal is used for storing new data in D latch, which can be represented as a potential of seen in output 164. Storing a new data 'high': If Din 148 and DI 152 are $V_{DD}$, transistor 150 and 154 turn on, which makes 164 'high' state through inverter 158. Storing a new data 'low': If Din_b 162 and DI 152 are $V_{DD}$, transistor 160 and 154 turn on, which make the potential of 164 ground ('low'). Outputs from S latch 120 and D latch 147 are input to a comparison circuit 166, shown as an XNOR gate having output 168 that controls transistor 180 coupled from the CE line 186 and through a series transistor 182 gated by signal pulse control signal P_C 184, so that the potential of the CE node is determined by the XNOR output value. The pulse control signal (P_C) 184 is used when the comparison step is executed. The CE node 186 is charged up through transistor 188 controlled by Load signal 190.

It should be appreciated that the result of the comparison (e.g., XNOR) is read by the differential amplifier and transferred to the S latch, since a write pulse is only necessary when the data to be set in the MTJ does not match the data already written into the MTJ. XNOR output 168 is also coupled through an inverter 170 (resulting in an XOR of S latch and D latch) driving a first transistor 172, in series with a second transistor 176 coupled to ground, which is controlled by pass/fail control signal PF_C 178, the combination of which determines the state of output 174 as the pass/fail check.

The operation of transistor 176 with PF_C 178 is as follows during the PF step. The potential of pass/fail output signal 174 is charged up to $V_{DD}$ by using an external circuitry and transistor 176 turns on by applying $V_{DD}$ at PF_C 178. Then, the potential of pass/fail output 174 is determined by the output of XOR (166+170). If the S latch and D latch match, the output of XOR will be 'low', the potential of pass/fail line 174 maintains $V_{DD}$, representing PASS. If the S latch and D latch mismatch, the output of XOR will be 'high', with the potential of pass/fail line 174 discharged to ground, representing FAIL. A differential amplifier 192 is seen receiving differential inputs CE 186, and Ref 103, with sense on signal S_On 196 driving a current drain transistor 194 which sinks current from both a first side with series transistors 198*a*, 198*b*, and a second side with transistors 200*a*, 200*b*. Transistors 198*a* and 200*a* have inverted gates and are tied together to one side of the differential amplifier, with the output 128 coupled back over to control transistor 126 of the S latch. Sense on S_On 196 signal is an enable signal of the differential amplifier 192. It should be appreciated that during the write step and PF step, the differential amplifier can turn off for low power operation.

S latch 120 and D latch 147 store the initial MTJ data and the external data, respectively, during the read step, while differential amplifier 192 amplifies the voltage difference between the Ref node and CE node and creates reliable logic value to the differential amplifier output node, Diff_out node, 128. The XNOR node holds the comparison value when evaluating the initial MTJ data versus the external data, determining whether a write pulse is generated, or not, during the Write step. A current feedback circuit is used to increase sensing margin.

The circuit is configured to maximize sensing margin and minimize the read disturbance, using a current feedback circuit including transistors 74, 76, 78. The reference resistor ($R_{ref}$) 84 is connected to transistor 74, and its resistance is $(R_P+R_{AP})/2$ for a centered sensing margin of AP and P. By way of example and not limitation the reference resistor can be implemented, via a serial and parallel combination of MTJs $(R_P+R_P \| R_P)$, or a digitally tunable CMOS based resistor circuit.

The operation of the current feedback circuit is as follows: a read operation is made up of a pre-charge stage, a BL discharge stage through a MTJ and a latch stage. During the pre-charge stage, the sense amplifier charges up the BL_ref and BL nodes to the same potential level because transistor 78 is fully turned on. Once transistor 78 is turned off, the BL discharge stage begins. If the MTJ has P ($R_P$), $I_{cell}$ would be larger than $I_{ref}$, causing the BL node to have a lower potential than that of the BL_ref node. The decreased potential of the BL node slightly turns off transistor 74, which reduces $I_{ref}$ further and leads the BL_ref node to discharge slowly. Therefore, the circuit is able to have a much larger potential difference between the Ref node, connected to the BL_ref, and the CE node, connected to the BL. Through circuit simulations, the average sensing margin reached 360 mV with 100% TMR, which is 2× larger as compared to that of conventional sense amplifiers using 200% TMR.

B. Simulation Results

To verify the functionality of the PWSA, the VCMA MTJ compact model, which describes precessional switching characteristic of the memory elements, was utilized in the Cadence Spectre circuit simulator with a 65 nm technology selected these simulations. The VCMA MTJ is assumed to have 100 kΩ resistance in the parallel state ($R_P$) and 200 kΩ in the anti-parallel state ($R_{AP}$), corresponding to the Tunneling Magnetoresistance (TMR) of 100%. Herein TMR is defined as $(R_{AP}-R_P)/R_P$. To improve the sensing margin, a current feedback circuit is utilized and a 150 kΩ reference resistance, as discussed in another section. The write pulse, which is being exemplified in this embodiment as having a 1.2 V amplitude and a 1.2 ns width, is designed to provide precessional switching with a probability larger than 99% write error rate (WER) less than or equal to 1%). In this section, two simulation cases are discussed.

(1) AP to P Switching

Figure 7:
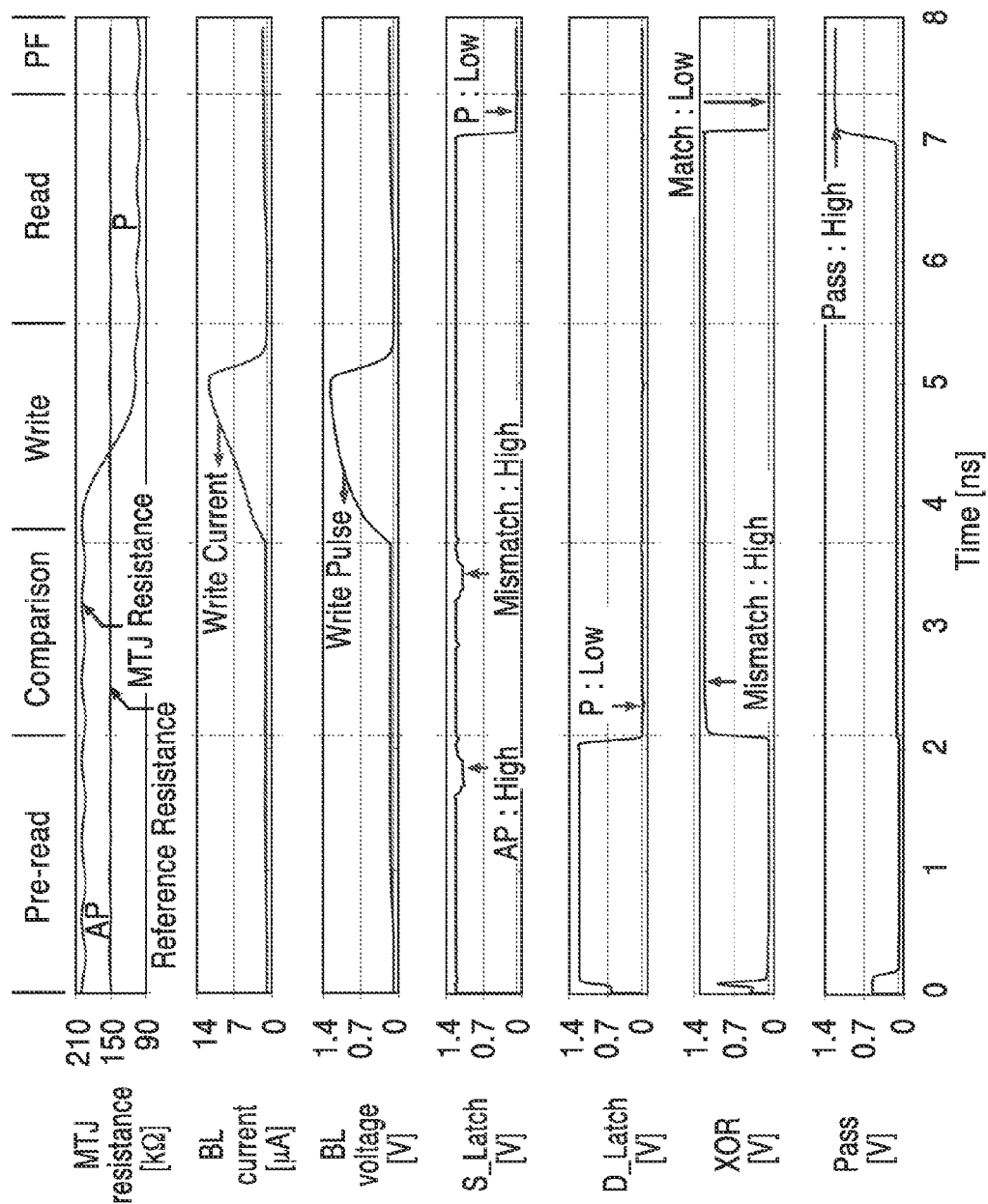
FIG. 7 and FIG. 8 are timing diagrams from a PWSA simulation according to an embodiment of the present disclosure, showing waveforms for AP-P switching and P-P non-switching.

FIG. 7 illustrates a timing diagram from a simulation performed for an example embodiment of PWSA for the present technology in the case where initial MTJ state is AP (logical 1), and the external data is P (logical 0). As seen at the top of this diagram the data programming operation consists of five consecutive steps: pre-read, comparison, write, read, and pass/fail check steps. Signals associated with these steps are seen at the left of the diagram as MTJ resistance (top), BL current, BL voltage, S_Latch, D_Latch, XOR, Pass, For this example operation, the AP state represents logic value 'high', and the P state represents logic value 'low'.

During the pre-read step, the S latch stores 'high' due to the AP state of the initial MTJ. At the comparison step, the D latch goes 'low' because the circuit has P as input for the external data. Mismatching data between the S latch and D latch generates a 'low' of the XNOR node, thus the S latch remains in the 'high' state. Under this condition, the circuit provides a 1.2V write pulse to the MTJ and the MTJ state switches from AP to P during the write step, which can be monitored by the resistance change as seen in the upper plot of the figure. Next, the PWSA reads the MTJ state, and the S latch changes to 'low', because the MTJ has switched from AP to P. At the final pass/fail check step, the 'high' Pass signal is transferred to the external circuit because the MTJ is correctly programmed.

(2) P to P Non-Switching

Figure 8:
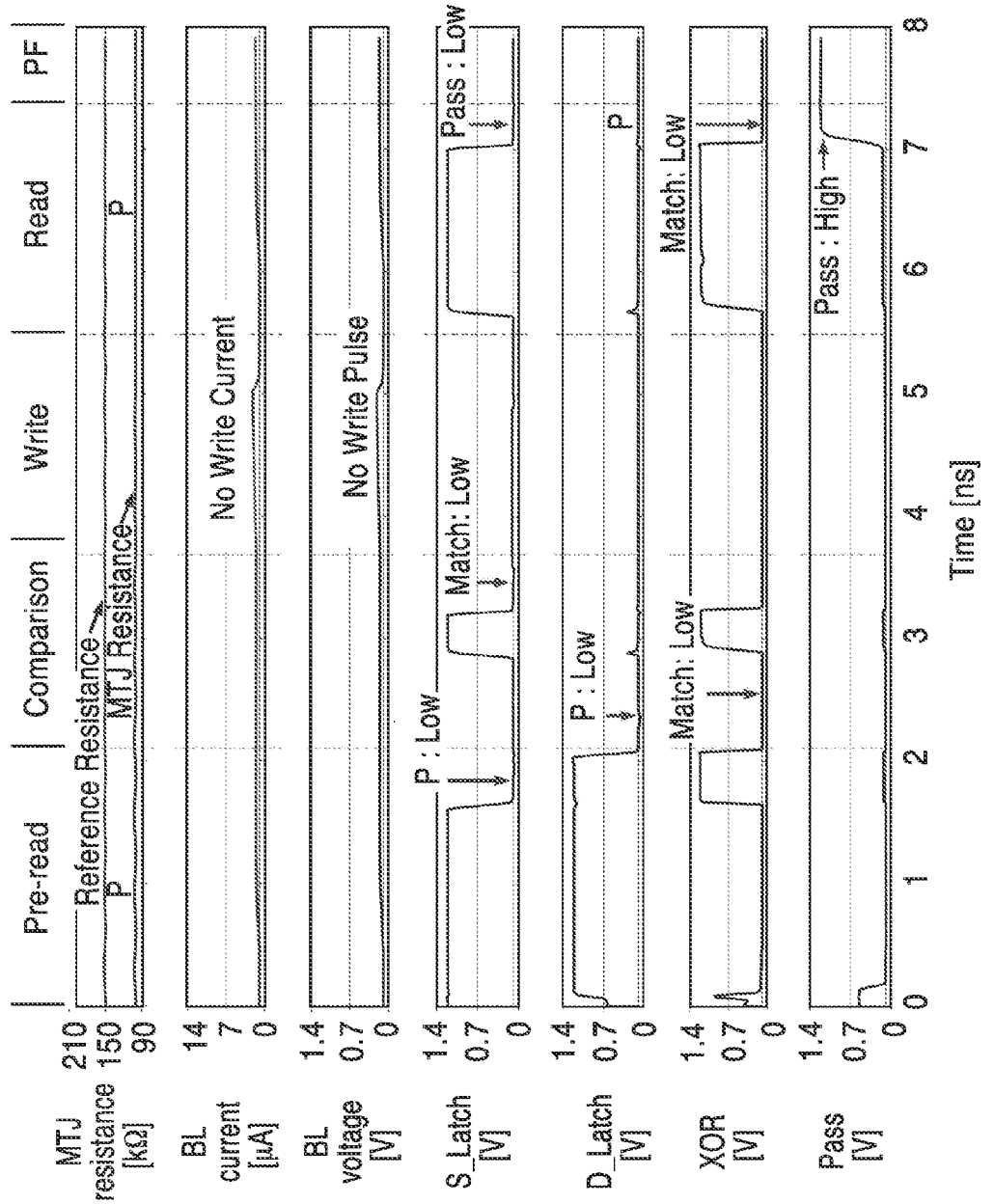

FIG. 8 illustrates a simulated timing diagram for an example embodiment of PWSA for the present technology in the case where no MTJ switching is required, specifically where the initial MTJ has P state, and the external data is also P, causing the S latch to be 'low' at the end of the comparison step. The same step sequence terms at the top of the figure, and signal lines along the left border are seen here as in the previous example of FIG. 7. Under the S latch 'low' condition (turning off transistor 114 in FIG. 6), the circuit does not generate a write pulse to the MTJ, and the MTJ state remains in its initial P. Next, the PWSA senses again the MTJ, and the pass signal maintains logic 'high' at the final step pass/fail check.

4. Performance

A. Sensing Margin

The sensing margin is affected not only by MTJ characteristics such as the TMR ratio, but also by circuit design parameters such as the size and the gate voltages of the transistors in the sense amplifier circuit. Previous works have reported sensing circuits with a 1T-1MTJ topology using MTJs with 200% TMR and 65 nm technology transistors, achieving 0.18V sensing margin. Here the object is to increase this potential difference to ensure that the differential amplifier can generate a reliable output signal to control CMOS logic.

Figure 9A:
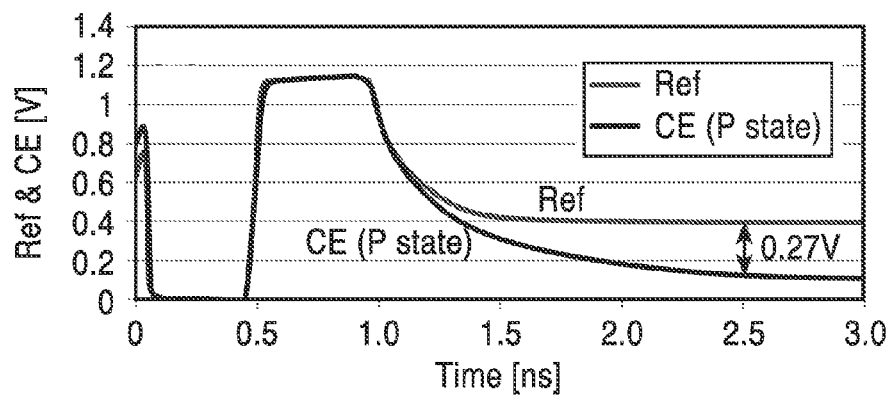
FIG. 9A through FIG. 9C are plots of sensing margin between CE and Ref for P state, AP state, and differential amplifier output according to an embodiment of the present disclosure.
Figure 9B:
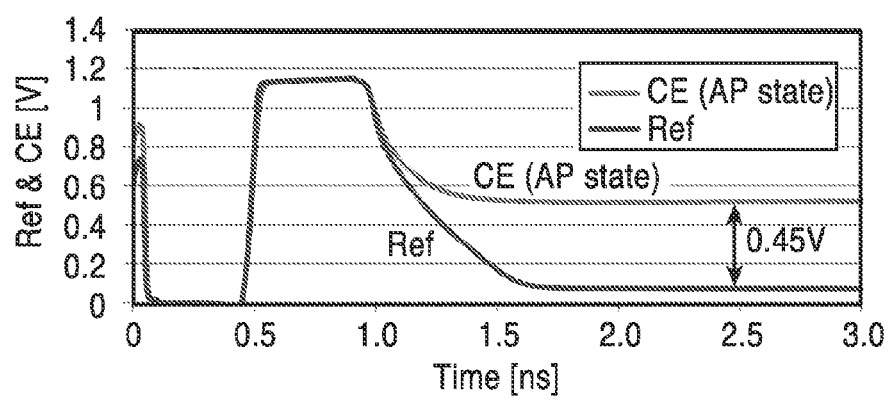
Figure 9C:
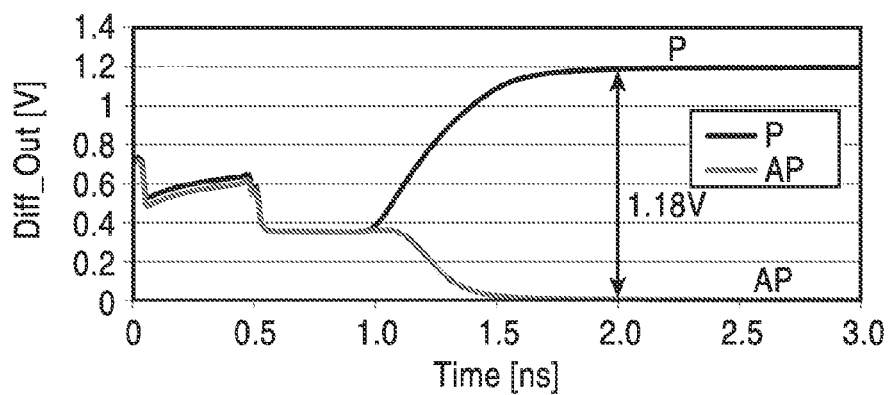

FIG. 9A through FIG. 9C depict sensing margin between P of MTJ and reference (Ref). Sensing margin is defined by the voltage difference between CE node and Ref node. The sensing margin voltage is seen as the difference between the P state and reference which is 0.27V in FIG. 9A, with the sensing margin between the AP state and reference seen as 0.45V in FIG. 9B. In FIG. 9C the output of the differential amplifier based on the average sensing margin, 0.36V, is sufficiently large to generate 'low' and 'high', with a read time of approximately 2 ns.

In the memory architecture, sensing margin and read disturbance are sensitive to the bias voltage applied to the bit line (BL). Applying higher voltage to the BL during the read operation generates larger read disturbance, causing reliability issues. On the other hand, applying low voltage to the BL results in a decreased sensing margin. The sensing margin for the circuit seen in FIG. 6 is determined by the voltage difference between the Ref node and the CE node. To maximize the sensing margin and minimize the read disturbance, a current feedback circuit is incorporated as was described in reference to FIG. 6. The improved sensing margin through the use of the current feedback circuit guarantees a stable logic swing as observed in FIG. 9A through FIG. 9C.

B. Speed

To evaluate the speed of the disclosed circuit, BL RC model was constructed based on the value of sheet resistance and metal capacitance of the considered 65 nm technology. The circuit embodiment achieved 2 ns read operating times as seen in FIG. 9C. Furthermore, because of transistors 74, 76 (M1 and M2) in FIG. 6A, the voltage drop across the MTJ is significantly reduced to ~70 mV, while sensing current decreases below 0.8 μA as seen in FIG. 7 through FIG. 9C, alleviating read disturbance issues.

Write time is determined by the switching characteristics of the MTJ. Since the precessional switching time of MTJs is fast at around 1 ns, the disclosed embodiments are able to achieve 1.8 ns write time, accounting for both write pulse generation, as well as BL discharging for the next read step, making this approach suitable for high-speed MRAM. Since the pass/fail (PF) check step is based on digital circuit operation, it takes only 0.5 ns to generate a pass/fail signal and does not result in a major penalty in terms of speed. If the circuit fails to write the MTJ due to WER, it executes additional write, read and pass/fail steps, increasing program operation time approximately 4.3 ns.

Figure 10:
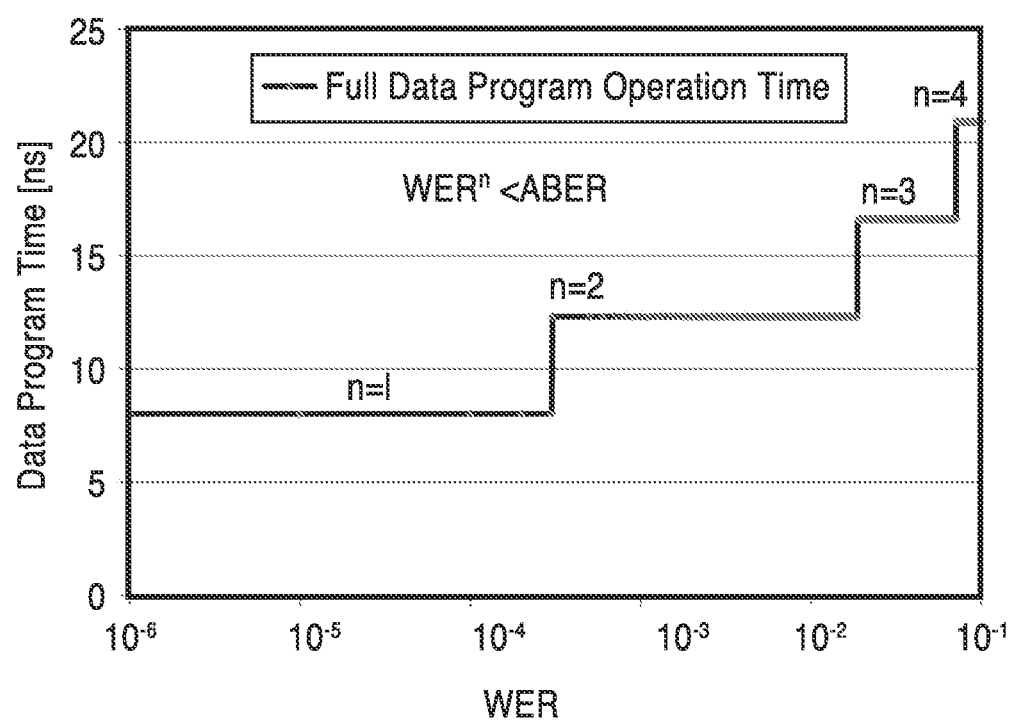
FIG. 10 is a plot of write error rate in relation to program time shown for an embodiment of the present disclosure.

FIG. 10 depicts a plot of WER in regard to data program time. Since the chance of pass and fail is directly related to the magnitude of WER, the full program operation time is a function of WER with a fixed value of acceptable bit error rate (ABER). It can be observed in the figure that even a worst case condition of WER=0.1 requires an average data program time of only about 20 ns, with the maximum number of write iterations as n=4. In this example it is assumed that ABER is equal to $3.6 \times 10^{-4}$ which is determined by a given ECC to handle approximately 1 Gbps read speed.

Table 1 compares the read and write times of previous sensing circuits in comparison with the circuits of the present disclosure (this work). Due to the high-speed precessional switching, the disclosed circuit achieves a 5× shorter write time than that achieved previously. Read time is also improved up to 3× compared to the former circuits, which is mainly attributed to the fact that the current feedback circuit boosts the potential difference between Ref node and CE node as shown in FIG. 8.

C. Power Consumption

The large resistance of the VCMA MTJ devices assures small write and read current, reducing dissipated power without impact on data programming speed as shown previously. Furthermore, since our PWSA consists of digital circuit components such as inverters and an XNOR, and only one analog component, a differential amplifier, the average current used by the PWSA is only 15 μA (excluding a write current to BL). The power consumption by the PWSA is 13% higher than the power required to write a VCMA-driven MTJ. Compared to a write power of STT-driven MTJ, the average power consumption of the PWSA is negligible. Therefore, the total power consumption of our PWSA is significantly reduced by eliminating the generation of write pulses (and its required sequence), if there is a match between old and new data in the MTJ. The most frequently occurring matching probability is 50% as expected, translating into an additional 50% saving in write power consumption under random data pattern conditions.

5. Conclusion

A pre-read and write sense amplifier including a write circuit for high-speed MRAM has been described and verified through Spectre simulations. The presented circuit topology increases sensing margin up to 2× over that of conventional approaches, reducing sensing errors. Due to the pre-read and comparison steps of the data program operation, the circuit is able to control the possible high WER and non-deterministic characteristics of precessional switching for MTJ devices, resulting in low power, low error rates and high-speed operation of MRAM suitable for GHz applications. The PWSA takes advantage of this ultra-fast switching scheme, achieving 2 ns write and read times and 8 ns of the first data program time. Furthermore, the size of write circuit transistors and access transistors in the memory cell can be reduced at least 10× because of VCMA driven precessional switching.

Accordingly, the disclosure presents a high-speed and low-power pre-read and write sense amplifier (PWSA) for magnetoresistive random access memory (MRAM). The sense amplifier incorporates a writing circuit for MRAM bits switched via timing of precessional dynamics (approximately GHz speed) in a magnetic tunnel junction (MTJ). By combining read and write functions in a single power-efficient circuit, the PWSA allows for fast read and write operations while minimizing the bit error rate (BER) after data programming. The PWSA circuit is designed based on a 65 nm CMOS technology, and the magnetic dynamics are captured by a Verilog-A compact model based on macrospin behavior for MTJs. Using the pre-read and comparison steps in the data program operation, write power consumption was reduced by up to 50% under random data input conditions. Furthermore, by using the voltage controlled magnetic anisotropy (VCMA) effect for precessional switching, more than 10× reduction of write power and transistor size both in the memory cell and the write circuit is achieved, compared to using the spin transfer torque (STT) effect. The circuit achieves 2 ns read time, 1.8 ns write time, and 8 ns total data program operation time (consisting of two read steps, one write step and a pass/fail check step) by using this PWSA concept, and a 2× larger sensing margin through the current feedback circuit.

The disclosed sense amplifier has been optimized to handle precessional switching of MTJs with high-WER. In addition, the circuit takes advantage of the favorable intrinsic characteristics of MTJs, i.e., high-speed and low energy switching. The circuit is designed to perform a read operation and to compare the current MTJ state to the incoming data, leading to a decision on whether a write pulse should be applied.

Second, the disclosed circuit approach has a simplified write circuitry, since MTJs driven by VCMA effect require uni-directional current and voltage source. Also, the size of transistors in a write circuit is at least 5× smaller than that of previous ones, because the maximum write current of MTJ driven by VCMA is below 20 μA.

Additionally, the disclosed circuit approach takes advantage of remarkable characteristics of Voltage-controlled magnetic anisotropy (VCMA) magnetic tunnel junction (MTJ). The disclosed PWSA is able to reduce not only data program operation time below 8 ns due to extremely fast voltage-controlled precessional switching, but also write power consumption because of low switching energy. Further, the precessional characteristic of MTJs is well controlled by using the Pre-read step and the Comparison step. Finally, the circuit decreases the BER, since it reduce the number of cells which to be programmed through the Pre-read and Comparison steps.

From the description herein, it will be appreciated that the present disclosure encompasses multiple embodiments which include, but are not limited to, the following:

1. A pre-read and write sense amplifier (PWSA) apparatus for magnetoresistive random access memory (MRAM), comprising: (a) a write and pre-charge circuit coupled to a bit line and bit line reference and respective center node and reference signals; (b) wherein said bit line is configured for coupling to magnetic tunnel junction (MTJ) cells in a magnetoresistive random access memory (MRAM); (c) a differential amplifier configured for reading state of a selected one of the MTJ cells; (d) a first data latch configured for retaining state as read by said differential amplifier, and to output that state to said write and pre-charge circuit; (e) a second data latch configured for storing a data state to which the selected one of the MTJ cells is to be set; (f) a control circuit coupled to said differential amplifier for performing logic and sequential operations; (g) a comparison circuit configured for comparing data retained by said first and second latches and outputting a comparison signal to said differential amplifier and said control circuit; (h) wherein said control circuit is configured to generate a write pulse for a precessional write operation to the selected one of the MTJ cells only if said comparison signal indicates that data retained in said first and second latches is different; (i) wherein said precessional write operation is performed by applying a pulse across the selected one of the MTJ cells, in which the pulse is of a selected duration to cause precession of magnetic moment in that MTJ cell to change its state from a first state to a second state, or from a second state back to a first state; (j) wherein said control circuit is configured for activating said differential amplifier for sensing data state in the selected one of the MTJ cells after it has been written, and in response to said comparison generating a pass/fail signal indicating if the write was successful.

2. The apparatus of any preceding embodiment, wherein said bit line is configured for connection to a multiplexer, configured for generating a plurality of bit line outputs for MJT cells.

3. The apparatus of any preceding embodiment, wherein said write and pre-charge circuit and said differential amplifier are configured for utilizing voltage controlled magnetic anisotropy (VCMA) effect for precessional switching on the MTJ cells.

4. The apparatus of any preceding embodiment, wherein said control circuit is further configured for performing an additional write operation into the selected one of the MTJ cells using the same data stored in said second latch, in response to receiving a pass/fail signal indicating the previous write was not successful.

5. The apparatus of any preceding embodiment, wherein said control circuit iterates write operations into the selected one of the MTJ cells until the pass/fail signal indicates a successful write, or until an attempt threshold condition is reached.

6. The apparatus of any preceding embodiment, wherein power consumption is reduced by approximately 50% in writing random data to MTJ cells since unnecessary write operations are eliminated in response to performing precessional write operation only if said comparison signal indicates that data retained in said first and second latches is different.

7. The apparatus of any preceding embodiment, wherein said write and pre-charge circuit is configured with a current feedback circuit which doubles the sensing margin when sensing MTJ cell state.

8. The apparatus of any preceding embodiment, wherein said current feedback circuit comprises a first transistor in series with the bit line (BL) having its gate coupled to the bit line reference (BL_ref), and a second transistor in series with the bit line reference (BL_ref) having its gate coupled to the bit line, while a third transistor is coupled between the bit line and bit line reference and whose gate is tied to a metastable state.

9. The apparatus of any preceding embodiment, wherein BL_ref is coupled to a reference resistor configured for generating a centered sensing margin of data states, AP and P, of the MJT cells.

10. The apparatus of any preceding embodiment, wherein said reference resistor comprises a serial and parallel combination of MTJs, or a digitally tunable CMOS based resistor circuit.

11. The apparatus of any preceding embodiment, wherein said write and pre-charge circuit and differential amplifier are configured for connection to MTJ cells that each comprise a first ferromagnetic layer (fixed layer) in which magnetic moment is fixed, a second ferromagnetic layer (free layer) in which magnetic moment is can change freely based on electrical and magnetic bias conditions, and a tunneling layer disposed between said first and second ferromagnetic layers.

12. The apparatus of any preceding embodiment, wherein said write and pre-charge circuit is configured to perform said precessional write operation by setting the free layer into a precessional motion around an in-plane magnetic field.

13. The apparatus of any preceding embodiment, wherein said differential amplifier is configured to transfer said comparison signal to said first latch in preparation for said precessional write operation.

14. A pre-read and write sense amplifier (PWSA) apparatus for magnetoresistive random access memory (MRAM), comprising: (a) a write and pre-charge circuit coupled to a bit line and bit line reference and respective center node and reference signals; (b) a current feedback circuit within said write and pre-charge circuit, wherein said current feedback circuit is configured for doubling sensing margin when sensing magnetic tunnel junction (MTJ) cell state; (c) a multiplexer coupled to said bit line and configured for generating a plurality of bit line outputs for a plurality of MTJ cells; (d) wherein said bit line is configured for coupling to magnetic tunnel junction (MTJ) cells in a magnetoresistive random access memory (MRAM); (e) a differential amplifier configured for reading precessional state of a selected one of the MTJ cells; (f) a first data latch configured for retaining a precessional state as read by said differential amplifier, and to output that state to said write and pre-charge circuit; (g) a second data latch configured for storing a data state to which the selected one of the MTJ cells is to be set; (h) a control circuit coupled to said differential amplifier for performing logic and sequential operations; (i) a comparison circuit configured for comparing data retained by said first and second latches and outputting a comparison signal to said differential amplifier and said control circuit; (j) wherein said control circuit is configured to generate a write pulse for a precessional write operation to the selected one of the MTJ cells only if said comparison signal indicates that data retained in said first and second latches is different; (k) wherein said precessional write operation is performed by applying a pulse across the selected one of the MTJ cells, in which the pulse is of sufficient duration to cause precession of magnetic moment in that MTJ cell to change its state from a first state to a second state, or from a second state back to a first state; (l) wherein said control circuit is configured for activating said differential amplifier for sensing data state in the selected one of the MTJ cells after it has been written, and in response to said comparison generating a pass/fail signal indicating if the write was successful.

15. The apparatus of any preceding embodiment, wherein said write and pre-charge circuit and said differential amplifier are configured for utilizing voltage controlled magnetic anisotropy (VCMA) effect for precessional switching on the MTJ cells.

16. The apparatus of any preceding embodiment, wherein said control circuit is further configured for performing an additional write operation into the selected one of the MTJ cells using the same data stored in said second latch, in response to receiving a pass/fail signal indicating the previous write was not successful.

17. The apparatus of any preceding embodiment, wherein said control circuit iterates write operations into the selected one of the MTJ cells until the pass/fail signal indicates a successful write, or until an attempt threshold condition is reached.

18. The apparatus of any preceding embodiment, wherein power consumption is reduced by approximately 50% in writing random data to MTJ cells since unnecessary write operations are eliminated in response to performing precessional write operation only if said comparison signal indicates that data retained in said first and second latches is different.

19. The apparatus of any preceding embodiment, wherein said current feedback circuit comprises a first transistor in series with the bit line (BL) having its gate coupled to the bit line reference (BL_ref), and a second transistor in series with the bit line reference (BL_ref) having its gate coupled to the bit line, while a third transistor is coupled between the bit line and bit line reference and whose gate is tied to a meta stable state.

20. The apparatus of any preceding embodiment, wherein BL_ref is coupled to a reference resistor configured for generating a centered sensing margin of data states, AP and P, of the MJT cells.

21. The apparatus of any preceding embodiment, wherein said reference resistor comprises a serial and parallel combination of MTJs, or a digitally tunable CMOS based resistor circuit.

22. The apparatus of any preceding embodiment, wherein said write and pre-charge circuit and differential amplifier are configured for connection to MTJ cells that each comprise a first ferromagnetic layer (fixed layer) in which magnetic moment is fixed, a second ferromagnetic layer (free layer) in which magnetic moment is can change freely based on electrical and magnetic bias conditions, and a tunneling layer disposed between said first and second ferromagnetic layers.

23. The apparatus of any preceding embodiment, wherein said write and pre-charge circuit is configured to perform said precessional write operation by setting the free layer into a precessional motion around an in-plane magnetic field.

24. The apparatus of any preceding embodiment, wherein said differential amplifier is configured to transfer said comparison signal to said first latch in preparation for said precessional write operation.

25. A method of performing data access of a magnetic tunnel junction (MTJ) cell in a magnetoresistive random access memory (MRAM), comprising: (a) performing pre-reading within a pre-read and write sense amplifier (PWSA) in which initial MTJ cell state is sensed by a sense amplifier and stored in a first latch; (b) comparing said initial MTJ cell state as stored in said first latch with new data to be written to that MTJ cell as stored in a second latch; (c) generating a write pulse to the MTJ cell during a write operation in response to said comparison indicating that data in said first and second latches is not equal; (d) performing a read through said PWSA to sense state of the MTJ cell after the write operation is performed; (e) comparing said MTJ cell state as stored in said first latch with data output during the write operation as stored in a second latch; and (f) generating a pass/fail signal indicating if the MTJ cell was properly programmed in the write operation or if the write operation failed.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

Sense amplifier performance comparison with previous works

| Reference | High sensitivity SI sensing circuit [2] | ISSCC 2007 [1] | ISSCC 2010 [3] | VLSI systems 2014 [4] | This Work (Simulation result) |
|---|---|---|---|---|---|
| Technology | 0.18 μm | 0.20 μm | 0.13 μm | 45 nm | 65 nm |
| Cell structure | 1T-1 MTJ | 1T-1MTJ | 1T-1MTJ | 1T-1MTJ | 1T-1MTJ |
| Supply Voltage | 2 V | 1.8 V | 1.2 V | 1 V | 1.2 V |
| Read time | 20 ns | 40 ns | 8 ns | 6.4 ns | 2 ns |
| Write time | — | 100 ns | 10 ns | — | 1.8 ns |
| Write Current | — | 0.2 mA (STT) | 0.4 mA (STT) | — | 12 μA (VCMA), 0.16 mA (STT) |

Articles from which Prior Works were compared:
[1] T. Kawahara, R. Takemura, and K. Miura, "2 Mb Spin-Transfer Torque RAM (SPRAM) with Bit-by-Bit Bidirectional Current Write and Parallelizing-Direction Current Read," in Solid-State Circuits Conference, 2007. ISSCC 2007. Digest of Technical Papers. IEEE International, 2007, pp. 480-481.
[2] E. K. S. Au, W. H. Ki, and W. H. Mow, "A novel current-mode sensing scheme for magnetic tunnel junction MRAM," IEEE Transactions on Magnetics, vol. 40, pp. 483-488, Mar 2004.
[3] D. Halupka, S. Huda, and W. Song, "Negative-resistance read and write schemes for STT-MRAM in 0.13 um CMOS," in Solid-State Circuits Conference Digest of Technical Papers (ISSCC), 2010 IEEE International, 2010, pp. 256-257.
[4] T. Na, J. Kim, and J. P. Kim, "An Offset-Canceling Triple-Stage Sensing Circuit for Deep Submicrometer STT-RAM," Very Large Scale Integration (VLSI) Systems, IEEE Transactions on, vol.PP, pp. 1-1,2014.

What is claimed is:

1. A pre-read and write sense amplifier (PWSA) apparatus for magnetoresistive random access memory (MRAM), comprising:

a write and pre-charge circuit coupled to a bit line and bit line reference and respective center node and reference signals;
wherein said bit line is configured for coupling to magnetic tunnel junction (MTJ) cells in a magnetoresistive random access memory (MRAM);
a differential amplifier configured for reading state of a selected one of the MTJ cells;
a first data latch configured for retaining state as read by said differential amplifier, and to output that state to said write and pre-charge circuit;
a second data latch configured for storing a data state to which the selected one of the MTJ cells is to be set;
a control circuit coupled to said differential amplifier for performing logic and sequential operations; and
a comparison circuit configured for comparing data retained by said first and second latches and outputting a comparison signal to said differential amplifier and said control circuit;
wherein said control circuit is configured to generate a write pulse for a precessional write operation to the selected one of the MTJ cells only if said comparison signal indicates that data retained in said first and second latches is different;
wherein said precessional write operation is performed by applying a pulse across the selected one of the MTJ cells, in which the pulse is of a selected duration to cause precession of magnetic moment in that MTJ cell to change its state from a first state to a second state, or from a second state back to a first state; and
wherein said control circuit is configured for activating said differential amplifier for sensing data state in the selected one of the MTJ cells after it has been written, and in response to said comparison generating a pass/fail signal indicating if the write was successful.

2. The apparatus as recited in claim 1, wherein said bit line is configured for connection to a multiplexer, configured for generating a plurality of bit line outputs for MJT cells.

3. The apparatus as recited in claim 1, wherein said write and pre-charge circuit and said differential amplifier are configured for utilizing voltage controlled magnetic anisotropy (VCMA) effect for precessional switching on the MTJ cells.

4. The apparatus as recited in claim 1, wherein said control circuit is further configured for performing an additional write operation into the selected one of the MTJ cells using the same data stored in said second latch, in response to receiving a pass/fail signal indicating the previous write was not successful.

5. The apparatus as recited in claim 4, wherein said control circuit iterates write operations into the selected one of the MTJ cells until the pass/fail signal indicates a successful write, or until an attempt threshold condition is reached.

6. The apparatus as recited in claim 1, wherein power consumption is reduced by approximately 50% in writing random data to MTJ cells since unnecessary write operations are eliminated in response to performing precessional write operation only if said comparison signal indicates that data retained in said first and second latches is different.

7. The apparatus as recited in claim 1, wherein said write and pre-charge circuit is configured with a current feedback circuit which doubles the sensing margin when sensing MTJ cell state.

8. The apparatus as recited in claim 7, wherein said current feedback circuit comprises a first transistor in series with the bit line (BL) having its gate coupled to the bit line reference (BL_ref), and a second transistor in series with the bit line reference (BL_ref) having its gate coupled to the bit line, while a third transistor is coupled between the bit line and bit line reference and whose gate is tied to a metastable state.

9. The apparatus as recited in claim 8, wherein BL_ref is coupled to a reference resistor configured for generating a centered sensing margin of data states, AP and P, of the MJT cells.

10. The apparatus as recited in claim 9, wherein said reference resistor comprises a serial and parallel combination of MTJs, or a digitally tunable CMOS based resistor circuit.

11. The apparatus as recited in claim 1, wherein said write and pre-charge circuit and differential amplifier are configured for connection to MTJ cells that each comprise a first ferromagnetic layer (fixed layer) in which magnetic moment is fixed, a second ferromagnetic layer (free layer) in which magnetic moment can change freely based on electrical and magnetic bias conditions, and a tunneling layer disposed between said first and second ferromagnetic layers.

12. The apparatus as recited in claim 11, wherein said write and pre-charge circuit is configured to perform said precessional write operation by setting the free layer into a precessional motion around an in-plane magnetic field.

13. The apparatus as recited in claim 1, wherein said differential amplifier is configured to transfer said comparison signal to said first latch in preparation for said precessional write operation.

14. A pre-read and write sense amplifier (PWSA) apparatus for magnetoresistive random access memory (MRAM), comprising:
a write and pre-charge circuit coupled to a bit line and bit line reference and respective center node and reference signals;
a current feedback circuit within said write and pre-charge circuit, wherein said current feedback circuit is configured for doubling sensing margin when sensing magnetic tunnel junction (MTJ) cell state;
a multiplexer coupled to said bit line and configured for generating a plurality of bit line outputs for a plurality of MTJ cells;
wherein said bit line is configured for coupling to magnetic tunnel junction (MTJ) cells in a magnetoresistive random access memory (MRAM);
a differential amplifier configured for reading precessional state of a selected one of the MTJ cells;
a first data latch configured for retaining a precessional state as read by said differential amplifier, and to output that state to said write and pre-charge circuit;
a second data latch configured for storing a data state to which the selected one of the MTJ cells is to be set;
a control circuit coupled to said differential amplifier for performing logic and sequential operations;
a comparison circuit configured for comparing data retained by said first and second latches and outputting a comparison signal to said differential amplifier and said control circuit;
wherein said control circuit is configured to generate a write pulse for a precessional write operation to the selected one of the MTJ cells only if said comparison signal indicates that data retained in said first and second latches is different;
wherein said precessional write operation is performed by applying a pulse across the selected one of the MTJ cells, in which the pulse is of sufficient duration to cause precession of magnetic moment in that MTJ cell to change its state from a first state to a second state, or from a second state back to a first state;

wherein said control circuit is configured for activating said differential amplifier for sensing data state in the selected one of the MTJ cells after it has been written, and in response to said comparison generating a pass/fail signal indicating if the write was successful.

15. The apparatus as recited in claim 14, wherein said write and pre-charge circuit and said differential amplifier are configured for utilizing voltage controlled magnetic anisotropy (VCMA) effect for precessional switching on the MTJ cells.

16. The apparatus as recited in claim 14, wherein said control circuit is further configured for performing an additional write operation into the selected one of the MTJ cells using the same data stored in said second latch, in response to receiving a pass/fail signal indicating the previous write was not successful.

17. The apparatus as recited in claim 16, wherein said control circuit iterates write operations into the selected one of the MTJ cells until the pass/fail signal indicates a successful write, or until an attempt threshold condition is reached.

18. The apparatus as recited in claim 14, wherein power consumption is reduced by approximately 50% in writing random data to MTJ cells since unnecessary write operations are eliminated in response to performing precessional write operation only if said comparison signal indicates that data retained in said first and second latches is different.

19. The apparatus as recited in claim 14, wherein said current feedback circuit comprises a first transistor in series with the bit line (BL) having its gate coupled to the bit line reference (BL_ref), and a second transistor in series with the bit line reference (BL_ref) having its gate coupled to the bit line, while a third transistor is coupled between the bit line and bit line reference and whose gate is tied to a meta stable state.

20. The apparatus as recited in claim 19, wherein BL_ref is coupled to a reference resistor configured for generating a centered sensing margin of data states, AP and P, of the MJT cells.

21. The apparatus as recited in claim 20, wherein said reference resistor comprises a serial and parallel combination of MTJs, or a digitally tunable CMOS based resistor circuit.

22. The apparatus as recited in claim 14, wherein said write and pre-charge circuit and differential amplifier are configured for connection to MTJ cells that each comprise a first ferromagnetic layer (fixed layer) in which magnetic moment is fixed, a second ferromagnetic layer (free layer) in which magnetic moment can change freely based on electrical and magnetic bias conditions, and a tunneling layer disposed between said first and second ferromagnetic layers.

23. The apparatus as recited in claim 22, wherein said write and pre-charge circuit is configured to perform said precessional write operation by setting the free layer into a precessional motion around an in-plane magnetic field.

24. The apparatus as recited in claim 14, wherein said differential amplifier is configured to transfer said comparison signal to said first latch in preparation for said precessional write operation.

25. A method of performing data access of a magnetic tunnel junction (MTJ) cell in a magnetoresistive random access memory (MRAM), comprising:
(a) performing pre-reading within a pre-read and write sense amplifier (PWSA) in which initial MTJ cell state is sensed by a sense amplifier and stored in a first latch;
(b) comparing said initial MTJ cell state as stored in said first latch with new data to be written to that MTJ cell as stored in a second latch;
(c) generating a write pulse to the MTJ cell during a write operation in response to said comparison indicating that data in said first and second latches is not equal;
(d) performing a read through said PWSA to sense state of the MTJ cell after the write operation is performed;
(e) comparing said MTJ cell state as stored in said first latch with data output during the write operation as stored in a second latch; and
(f) generating a pass/fail signal indicating if the MTJ cell was properly programmed in the write operation or if the write operation failed.

* * * * *